(12) United States Patent
Kern et al.

(10) Patent No.: US 8,966,355 B2
(45) Date of Patent: Feb. 24, 2015

(54) APPARATUS AND METHOD FOR COMPARING PAIRS OF BINARY WORDS

(75) Inventors: Thomas Kern, Munich (DE); Ulrich Backhausen, Taufkirchen (DE); Michael Goessel, Mahlow (DE); Thomas Rabenalt, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 298 days.

(21) Appl. No.: 13/430,147

(22) Filed: Mar. 26, 2012

(65) Prior Publication Data

US 2013/0212452 A1 Aug. 15, 2013

Related U.S. Application Data

(60) Provisional application No. 61/599,129, filed on Feb. 15, 2012.

(51) Int. Cl.
*H03M 13/00* (2006.01)
*G06F 11/00* (2006.01)
(Continued)

(52) U.S. Cl.
CPC ...... *H03M 13/3746* (2013.01); *H03M 13/6575* (2013.01); *H03M 13/3738* (2013.01); *H03M 13/3784* (2013.01); *H03M 13/155* (2013.01); *H03M 13/033* (2013.01);
(Continued)

(58) Field of Classification Search
CPC .......... H03M 13/3746; H03M 13/3784; H03M 13/3738; H03M 13/6575; H03M 13/155; H03M 13/19; H03M 13/033; H03M 13/258; H03M 13/2948; H03M 13/2957; H03M 13/2966; H03M 13/299; H03M 13/37; G06F 11/00; G06F 11/1048; G06F 11/1479
USPC .......................................... 714/780, 799, 819
See application file for complete search history.

(56) References Cited

U.S. PATENT DOCUMENTS 4,035,766 A * 7/1977 Barker .......................... 714/805
7,127,668 B2 * 10/2006 McBryde et al. ............. 714/801
(Continued)

FOREIGN PATENT DOCUMENTS

WO 2012004065 A1 1/2012

OTHER PUBLICATIONS

US Patent Application dated Mar. 26, 2012 U.S. Appl. No. 13/430,126.
Kundu, S., et al. "Self-Checking Comparator with One Periodic Output." IEE Transactions on Computers, vol. 45, No. 3. Mar. 1996.
Non Final Office Action Dated Nov. 19, 2014 U.S. Appl. No. 13/430,126.

*Primary Examiner* — John J Tabone, Jr.
(74) *Attorney, Agent, or Firm* — Eschweiler & Associates, LLC

(57) ABSTRACT

An apparatus for comparing pairs of binary words includes an intermediate value determiner and an error detector. The intermediate value determiner determines an intermediate binary word so that the intermediate binary word is equal to a reference binary word for a first pair of equal or inverted binary words, so that the intermediate binary word is equal to the inverted reference binary word for a second pair of equal or inverted binary words and so that the intermediate binary word is unequal to the reference binary word and the inverted reference binary word for a pair of unequal and uninverted binary words, if the intermediate value determiner works faultlessly. Further, the error detector provides an error signal based on the intermediate binary word so that the error signal indicates whether or not the binary words of a pair of binary words are equal or inverted.

14 Claims, 6 Drawing Sheets

(51) Int. Cl.
- *H03M 13/37* (2006.01)
- *H03M 13/15* (2006.01)
- *H03M 13/03* (2006.01)
- *H03M 13/19* (2006.01)
- *H03M 13/29* (2006.01)
- *H03M 13/25* (2006.01)
- *G06F 11/10* (2006.01)
- *G06F 11/14* (2006.01)

(52) U.S. Cl.
CPC ......... *H03M 13/19* (2013.01); *H03M 13/2948* (2013.01); *H03M 13/2957* (2013.01); *H03M 13/258* (2013.01); *G06F 11/00* (2013.01); *H03M 13/299* (2013.01); *H03M 13/2966* (2013.01); *H03M 13/37* (2013.01); *G06F 11/1048* (2013.01); *G06F 11/1479* (2013.01)
USPC .......................... 714/819; 714/780; 714/799

(56) References Cited

U.S. PATENT DOCUMENTS

| | | | |
|---|---|---|---|
| 7,203,890 B1* | 4/2007 | Normoyle | 714/768 |
| 7,861,131 B1* | 12/2010 | Xu et al. | 714/752 |
| 8,069,392 B1* | 11/2011 | Norrie | 714/758 |
| 8,086,945 B1* | 12/2011 | Xu et al. | 714/801 |
| 8,136,009 B2* | 3/2012 | Goessel et al. | 714/757 |
| 2007/0277070 A1* | 11/2007 | Janke et al. | 714/736 |
| 2009/0289663 A1 | 11/2009 | Sogomonyan et al. | |
| 2011/0041013 A1* | 2/2011 | Ingimundarson | 714/40 |
| 2011/0138249 A1* | 6/2011 | Kern et al. | 714/755 |
| 2012/0054580 A1* | 3/2012 | Sakaue | 714/763 |
| 2012/0144260 A1* | 6/2012 | Kern et al. | 714/752 |
| 2012/0166890 A1 | 6/2012 | Janarthanam et al. | |
| 2013/0103991 A1* | 4/2013 | Evain et al. | 714/701 |

\* cited by examiner

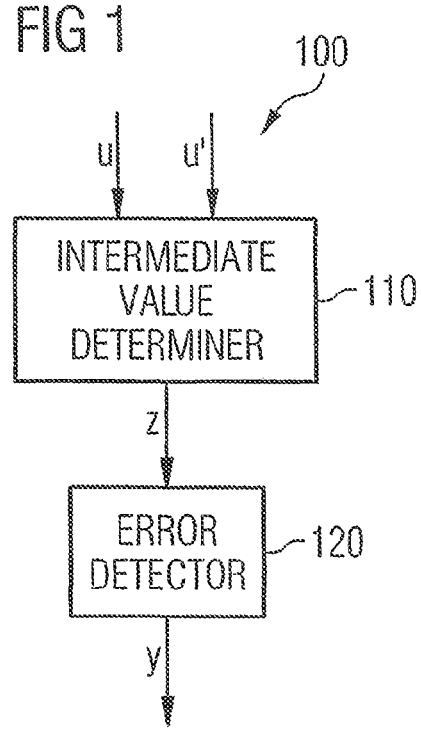
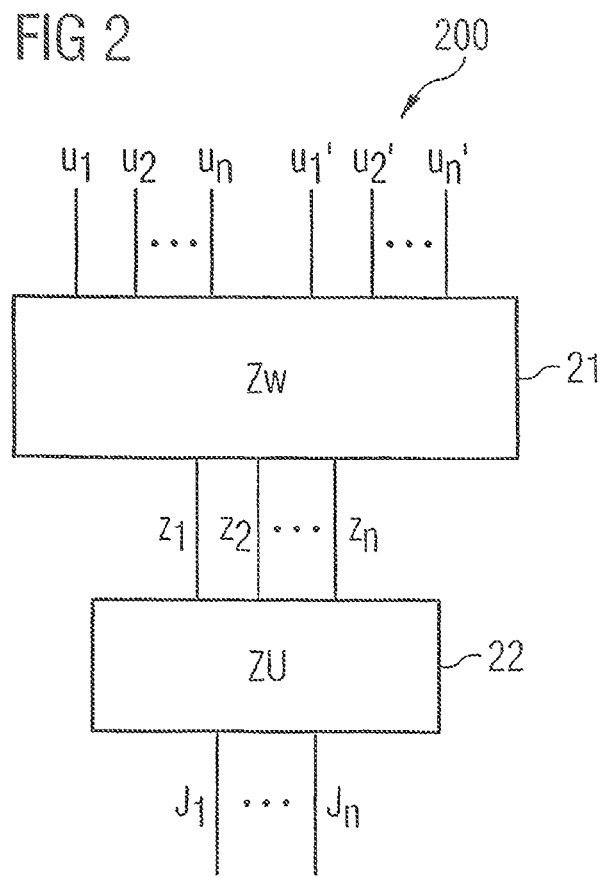

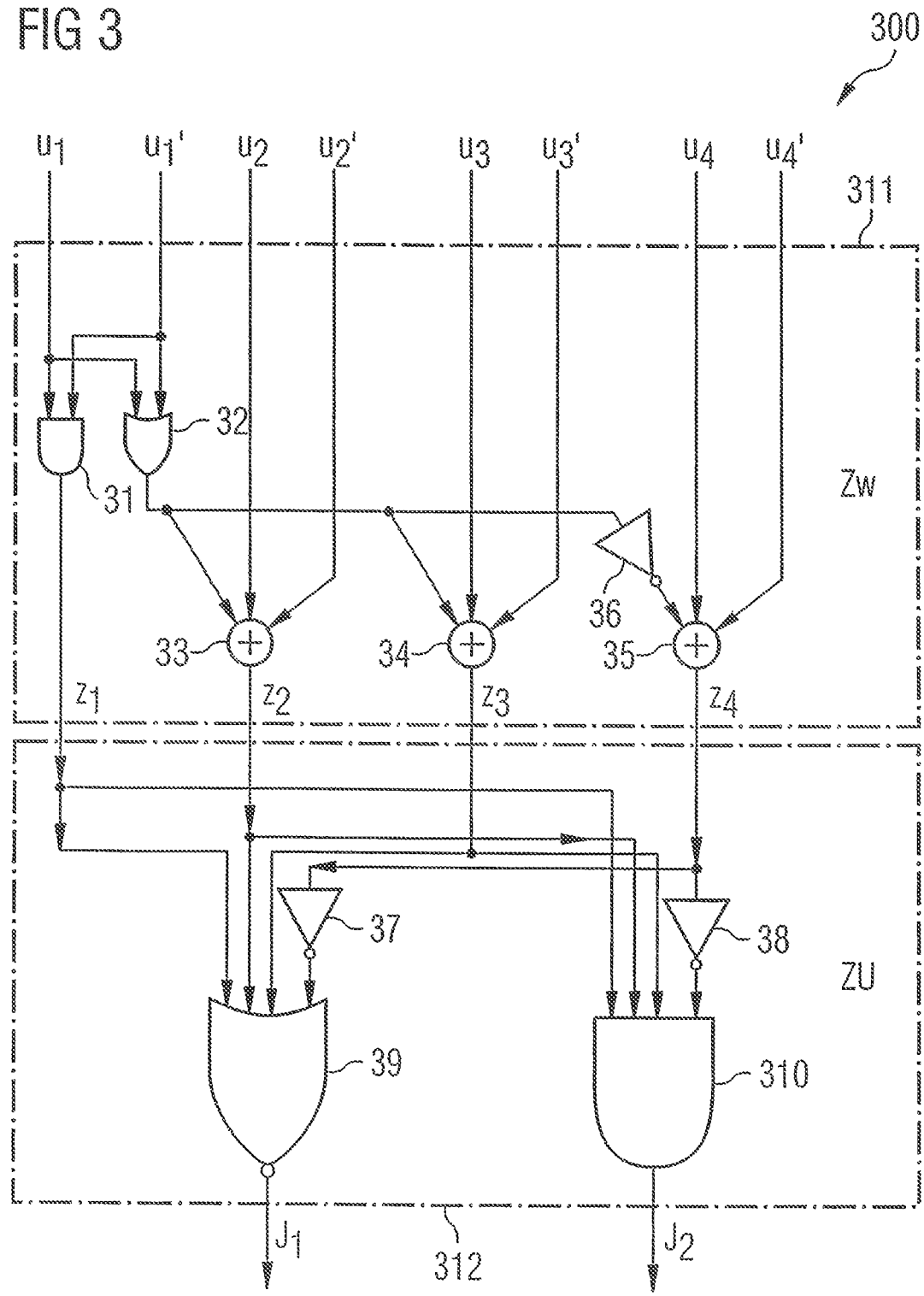

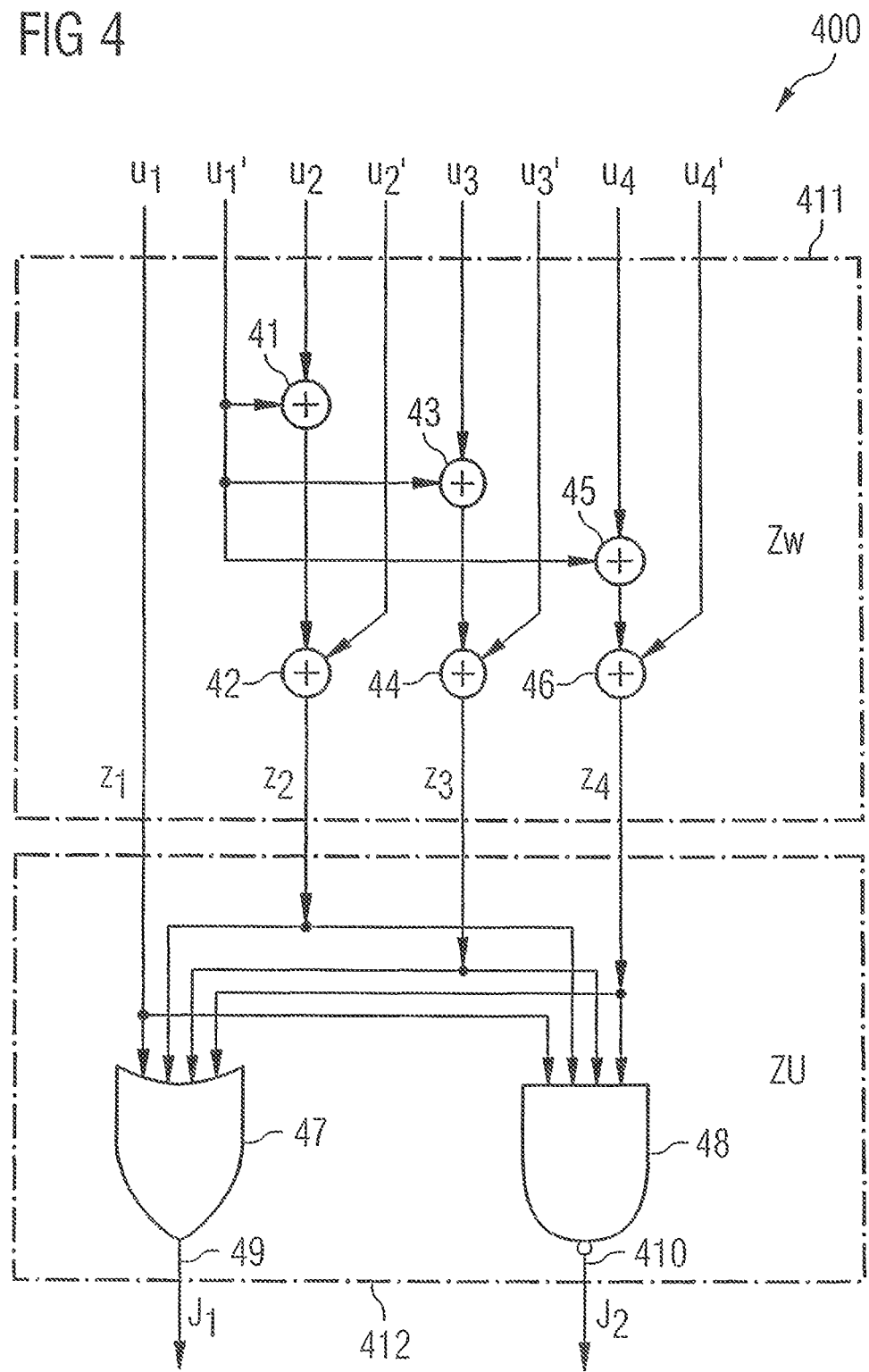

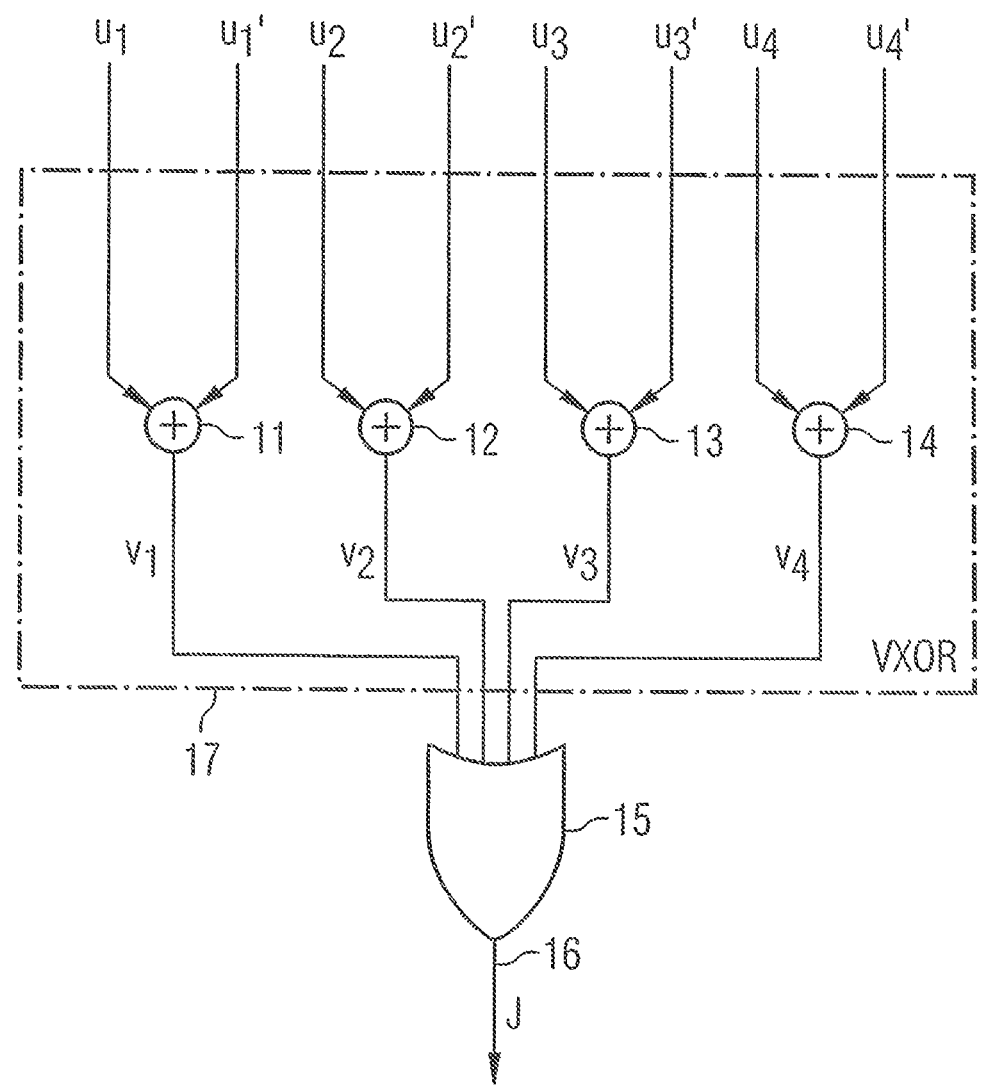

APPARATUS AND METHOD FOR COMPARING PAIRS OF BINARY WORDS

CROSS-REFERENCE TO RELATED APPLICATIONS

This application is related to, and filed concurrently on Mar. 26, 2012 with U.S. patent application Ser. No. 13/430,126 entitled "System and Method for Signature-Based Redundancy Comparison," and claims priority to provisional application Ser. No. 61/599,129, filed on Feb. 15, 2012 the contents of which are hereby incorporated by reference.

FIELD

Embodiments according to the invention relate to error detection concepts in electrical circuits and particularly to an apparatus and a method for comparing pairs of binary words.

BACKGROUND

Due to the high integration density of modern electronic circuits and storages, the frequency of errors increases.

Therefore, the implementation of error detection mechanisms in such electronic circuits is of high interest. One possible implementation of such error detection mechanisms is the design of self-checking structures within electronic circuits, i.e. structures which detect their own faults during normal operation. Since comparators are often used for the design of self-checking circuits it is of special interest to design simple comparators which detect their own internal faults during normal operation.

FIG. 8 illustrates a conventional comparator. By the comparator of FIG. 8, the data words $u=u_1, \ldots, u_n$ and $u'=u'_1, \ldots, u'_n$ are compared with respect to uniformity or equality. If u and u' are not equal, an error signal y=1 is output at the output 16 of the comparator. If u and u' are equal, a signal y=0 is output at the output 16 of the allocator 15.

The comparator consists of XOR operator VXOR 17 having 2n=8 inputs to which the components $u_1, u_2, u_3, u_4$ and $u_1', u_2', u_3', u_4'$ of the data words u and u' are applied and n outputs for outputting an n digit XOR combined value $v=v_1, \ldots, v_n$. In FIG. 8, n=4 was selected. Connected downstream from the XOR operator VXOR 17, an OR gate 15 having n=4 inputs is connected for inputting the XOR values $v_1, \ldots, v_n$ and having an output for outputting an error signal y.

The XOR values $v=v_1, \ldots, v_4$ are formed according to the following relations $$v_1 = u_1 \oplus u_1'$$

$$v_2 = u_2 \oplus u_2'$$

$$v_3 = u_3 \oplus u_3'$$

$$v_n = u_n \oplus u_4'$$

from which then the output value y of the comparator is determined $$y = \bigvee_{i=1}^{4} v_i.$$

The XOR operator 17 of FIG. 8 consists of the 4 XOR gates 11, 12, 13 and 14, each comprising two inputs and one output.

First, the recognizability of errors of the comparator in running operation is considered.

At the XOR gate 11, at its two inputs the values $u_1, u_1'$ are applied which are equal as long as no error occurs in u or u'. At the XOR gate 11, thus only the values 0, 0 or 1, 1 are applied, which are each combined to 0 and are output at its output and thus at the first output of the XOR operator 17 carrying the signal $v_1$. Similarly, at the further XOR gates 12, 13 and 14 of the XOR operator VXOR 17, as long as no error occurs in u or u', only the values 0, 0 or 1, 1 are applied and at their outputs the value 0 is output. At the n=4-component output of the XOR operator, thus always the value $v=v_1, v_2, v_3, v_4=0, 0, 0, 0$ is output, as long as u and u' are not different.

SUMMARY

An embodiment provides an apparatus for comparing pairs of binary words comprising an intermediate value determiner and an error detector. The intermediate value determiner is configured to determine an intermediate binary word, so that the intermediate binary word is equal to a reference binary word for a first pair of equal or inverted binary words, so that the intermediate binary word is equal to the inverted reference binary word for a second pair of equal or inverted binary words and so that the intermediate binary word is unequal to the reference binary word and the inverted reference binary word for a pair of unequal and uninverted binary words if the intermediate value determiner works faultlessly. The first pair of equal or inverted binary words is different from the second pair of equal or inverted binary words. Further, the error detector is configured to provide an error signal based on the intermediate binary word, so that the error signal indicates whether or not the binary words of a pair of binary words are equal or inverted if the intermediate value determiner works faultlessly, and indicates whether or not the intermediate value determiner works faultlessly if the binary words of a pair of binary words are equal or inverted.

By determining an intermediate binary word, which is either equal to a reference binary word or to the inversion thereof for different pairs of equal or inverted binary words, stuck-at errors within the intermediate value determiner can be detected, since each bit of the intermediate binary word carries for some pairs of equal or inverted binary words a 0 and for other pairs of equal or inverted binary words a 1. Therefore, despite correct input signals (pairs of equal or inverted binary words) are provided to the intermediate value determiner, a constant output signal for these correct input signals can be avoided due to the proposed determination of the intermediate binary word. Based on this intermediate binary word the error detector can detect an erroneously working intermediate value determiner, especially but not exclusively, if a stuck-at error within the intermediate value determiner appears. Therefore, the error detection probability in the running operation can be significantly improved.

BRIEF DESCRIPTION OF THE DRAWINGS

Embodiments according to the invention will be detailed subsequently referring to the appended drawings, in which:

FIG. 1 is a block diagram of an apparatus for comparing pairs of binary words;

FIG. 2 is a block diagram of a comparator for comparing two n-digit data words u and u';

FIG. 3 is a block diagram of a comparator with a nonlinear function $f$

FIG. 4 is a block diagram of a comparator with a linear function $f$

FIG. 8 is a block diagram of a known comparator.

DETAILED DESCRIPTION

Figure 5:
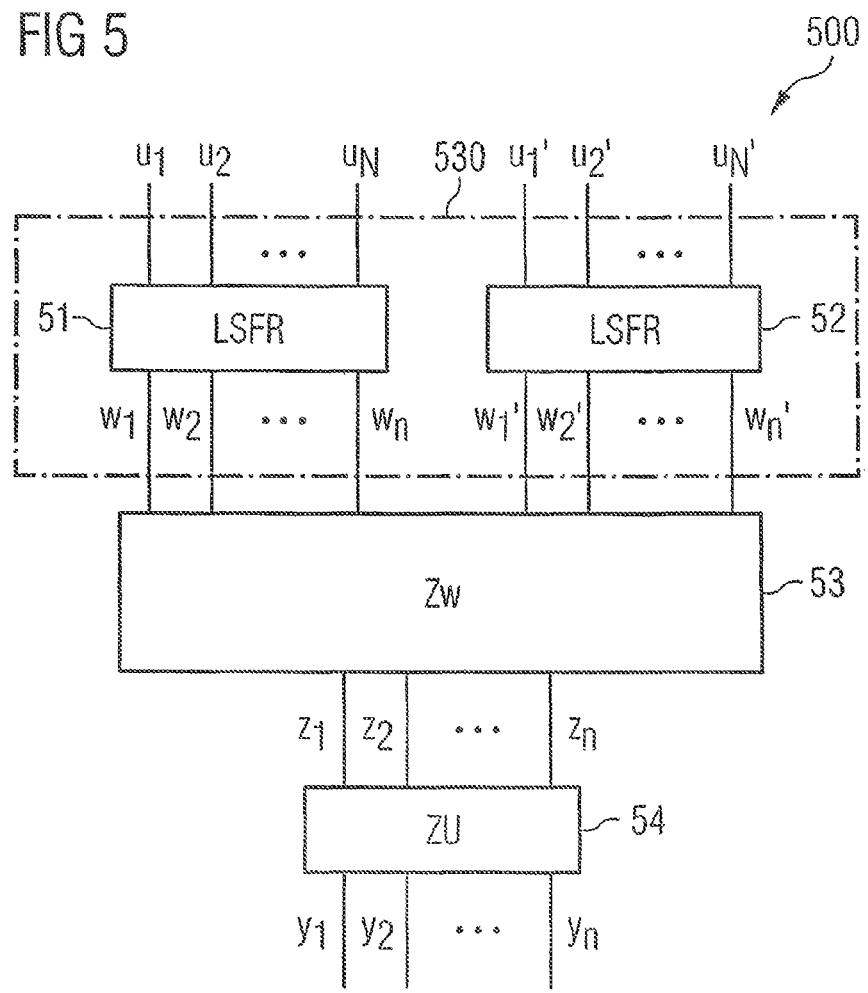
FIG. 5 is a block diagram of a comparator for comparing two n-digit data words u and u' with an upstream linear feedback shift register.

In the following, the same reference numerals are partly used for objects and functional units having the same or similar functional properties and the description thereof with regard to a figure shall apply also to other figures in order to reduce redundancy in the description of the embodiments.

FIG. 1 shows a block diagram of an apparatus 100 for comparing pairs of binary words u, u' according to an embodiment. The apparatus 100 comprises an intermediate value determiner 110 connected to an error detector 120. The intermediate value determiner 110 determines an intermediate binary word z, so that the intermediate binary word z is equal to a reference binary word for a first pair of equal or inverted binary words and so that the intermediate binary word z is equal to the inverted reference binary word for a second pair of equal or inverted binary words. Further, the intermediate value determiner 110 determines the intermediate binary word z so that the intermediate binary word z is unequal to the reference binary word and the inverted reference binary word for a pair of unequal and uninverted binary words. This determination of the intermediate binary word takes place, if the intermediate value determiner works faultlessly. In this connection, the first pair of equal or inverted binary words is different from the second pair of equal or inverted binary words, which shows that at least for two different pairs of equal or inverted binary words, the intermediate binary word z is equal to the reference binary word in one case and equal to the inverted reference binary word in the second case (guaranteeing a non-constant value for each bit of the intermediate binary word for at least these two different pairs of equal or inverted binary words). The error detector 120 provides an error signal y based on the intermediate binary word z, so that the error signal y indicates whether or not the binary words of a pair of binary words u, u' are equal or inverted (to each other), if the intermediate value determiner 110 works faultlessly and indicates whether or not the intermediate value determiner 110 works faultlessly, if the binary words u, u' of a pair of binary words are equal or inverted (to each other).

The described intermediate value determiner 110 determines the intermediate binary word z, so that the bits of the intermediate binary word z are not constant (comprising not constant values) for different pairs of equal or inverted binary words. This is a consequence of the mapping of the first pair of equal or inverted binary words to the reference binary word and the mapping of the second pair of equal or inverted binary word to the inversion of the reference binary word. Further, pairs of unequal and uninverted binary words are mapped to bit sequences unequal to the reference binary word and the inverted reference binary word. Therefore, stuck-at errors within the intermediate value determiner 110 are detectable, since in the stuck-at error case, at least one bit (using a signal line comprising the stuck-at error) stays constant for all pairs of equal or inverted binary words. Consequently, the error detection probability, especially for stuck-at errors, can be significantly increased.

The apparatus 100 compares pairs of binary words to detect unequal and uninverted binary words resulting from a possible failure during a preceding processing. In this connection, a binary word is a bit sequence with an arbitrary number of bits (e.g. 4, 8, 10, 16, 17, 32, 64 or 128 bit), wherein all binary words to be compared by the apparatus 100 comprise the same arbitrary number of bits. Preferably, the bits of a binary word are provided to the apparatus 100 in a parallel manner, which means the apparatus 100 and particularly the intermediate value determiner 110 comprises an input for each bit of the binary words of a pair of binary words. For example, if each binary word comprises four bits, the intermediate value determiner comprises eight inputs, one for each bit of the two binary words of the pair of binary words.

In connection with the description of the apparatus 100, it is assumed that the preceding processing of a pair of binary words before providing them to the apparatus 100 was faultless, if the binary words of the pair of binary words are equal or inverted to each other at the input of the apparatus 100. For example, if a first binary word of the pair of binary words comprises the value 1010 and the second binary word of the pair of binary words comprises the value 1010 (for the equal case) or 0101 (for the inverted case), the preceding processing of the pair of binary words was most likely faultless (excluding failures accidentally resulting in equal or inverted binary words).

In these two cases, for equal or inverted binary words, the intermediate value determiner 110 determines an intermediate binary word z equal to a reference binary word or the inverted referenced binary word. The reference binary word is a bit sequence with a predefined value. This predefined value may be arbitrarily defined, preferably it may be an all-0 bit sequence or an all-1 bit sequence (e.g. 0000 or 1111). The inverted reference binary word is equal to an inversion of the predefined bit sequence of the reference binary word (e.g. 1111 if the reference binary word is equal to 0000 or 0000 if the reference binary word is equal to 1111).

The intermediate value determiner 110 is implemented in a way that at least for a first pair of equal or inverted binary words the intermediate binary word is equal to the reference binary word and for a second pair of equal or inverted binary words the intermediate binary word z is equal to the inverted reference binary word. Therefore, if the first pair of equal or inverted binary words is provided to the intermediate value determiner 110 each bit of the intermediate binary word z comprises another value than in the case of providing the second pair of equal or inverted binary words to the intermediate value determiner 110. Therefore, stuck-at errors may be detectable based on the intermediate binary word z, since in this case at least one bit of the intermediate binary word stays constant.

A pair of unequal and uninverted (non-inverted) binary words indicates an error during the preceding processing of the pair of binary words. In this connection, the term uninverted means that the two binary words of a pair of binary words are not inverted to each other. The intermediate value determiner 110 determines the intermediate binary word z, so that the intermediate binary word z is unequal to the reference binary word and the inverted reference binary word for a pair of unequal and uninverted binary words. Therefore, the intermediate binary word z indicates also an error during the preceding processing, if the intermediate value determiner 110 works faultlessly.

Based on the intermediate binary word z, the error detector 120 is able to detect an erroneous preceding processing of a pair of binary words or an erroneous processing of a pair of binary words by the intermediate value determiner. For this, the error detector 120 determines and provides an error signal y as mentioned above.

For an erroneously working intermediate value determiner 110 (e.g. due to a stuck-at error) in combination with a pair of unequal and uninverted binary words of a pair of binary words, the error signal y may wrongly indicate a faultlessly working intermediate value determiner and a pair of equal or inverted binary words. However, as soon as a correct pair of equal or inverted binary words is provided to the intermediate value determiner 110, the error signal y correctly indicates the erroneously working intermediate value determiner 110, so that a detection of a stuck-at error within the intermediate value determiner 110 may be guaranteed over time.

An intermediate binary word z with the properties mentioned above can be obtained in various ways. For example, the intermediate value determiner 110 may determine a bit of the intermediate binary word z so that the bit of the intermediate binary word z is equal to a value derivable by an intermediate bit Boolean function depending on at least one bit $u_i$, $u_i'$ of a pair of binary words u, u' to be compared.

This general but complicated formulation is necessary, since a hardware implementation (the intermediate value determiner is usually implemented in hardware) of a Boolean function may be realized in various ways. Especially if several Boolean functions (for example one Boolean function for each bit of the intermediate binary word) are realized by a common hardware unit, logical units (and the transistors representing the logical units) may be used at least partly in common for the realization of more than one of the Boolean functions as well as an optimization of the hardware may simplify a Boolean function so that the original Boolean function is not directly identifiable in the concrete hardware implementation anymore. However, the resulting bit of the intermediate binary word z is still equal to a value derivable by the originally defined Boolean function, which is in this case called intermediate bit Boolean function.

For example, the intermediate bit Boolean function may depend on an XOR-combination (realized by a logical XOR combiner unit realizing a logical exclusive OR function) of a bit $u_i$ of a first binary word u of the pair of binary words u, u', a corresponding bit $u_i'$ of the second binary word u' of the pair of binary words u, u' and a common Boolean function $f$. In this example, the common function $f$ depends on at least one bit $u_i$ or $u_i'$ of the pair of binary words u, u', which means that the common Boolean function $f$ is not constant (not equal to a constant value). Further, the common Boolean function $f$ is unequal to an XOR-combination and to an inverted XOR-combination of a bit $u_i$ of the first binary word u of the pair of binary words u, u' and a corresponding bit $u_i'$ of the second binary word u' of the pair of binary words u, u'. In this case, an exclusive XOR-combination and an exclusive inverted XOR-combination of a bit of the first binary word and a corresponding bit of the second binary word u' is meant. However, an XOR-combination of a bit $u_i$ of the first binary word u and a corresponding bit $u_i'$ of the second binary word u' and one or more further other bits of the first binary word u or the second binary word u' are possible. For the common Boolean function f the conditions $$f(u_1, u_1', \ldots, u_n, u_n') \neq \text{const}$$

$$f(u_1, u_1', \ldots, u_n, u_n') \neq u_i \oplus u_i' \text{ for } i=1, \ldots, n$$

and $$f(u_1, u_1', \ldots, u_n, u_n') \neq u_i \oplus u_i' \oplus 1 \text{ for } i=1, \ldots, n$$

should be satisfied.

Further, the intermediate bit Boolean function may depend on an XOR-combination with a binary constant $A_i$. For example, the consideration of a binary constant equal to 1 results in an inversion of the remaining part of the intermediate bit Boolean function. On the other hand, the intermediate bit Boolean function stays unchanged if a binary constant equal to 0 is considered. By considering binary constants for the determination of the intermediate binary word z, an arbitrary bit sequence can be predefined for the reference binary word (e.g. an all-0 or all-1 bit sequence).

For the determination of the whole intermediate binary word z, each bit $z_i$ of the intermediate binary word z is equal to a value derivable by an individual intermediate bit Boolean function. Preferably, the individual intermediate bit Boolean functions are different from each other. In other words, each bit $z_i$ of the intermediate binary word z may be derivable based on a different intermediate bit Boolean function. Otherwise, the intermediate binary word z would contain unnecessary redundant data.

As mentioned above, an intermediate bit Boolean function may depend, among others, on a common Boolean function. The common Boolean function may be the same Boolean function for each (individual) intermediate bit Boolean function of the bits $z_i$ of the intermediate binary word z. In other words, each bit $z_i$ of the intermediate binary word z may be equal to a value derivable by an individual intermediate bit Boolean function, each individual intermediate bit Boolean function depending on the same common Boolean function. In other words, each individual intermediate bit Boolean function comprises a part that is the same for all intermediate bit Boolean functions, and a part that is different from all other intermediate bit Boolean functions (making the intermediate bit Boolean function individual).

The common Boolean function $f$ may depend linearly or nonlinearly on the bits $u_i$, $u_i'$ of a pair of binary words u, u'. For example, the common Boolean function $f$ may depend linearly on at least one bit $u_i$, $u_i'$ of a pair of binary words u, u' without any nonlinear dependency on a bit $u_i$, $u_i'$ of the pair of binary words u, u'. In another example, the common Boolean function $f$ may depend nonlinearly on a bit $u_i$, $u_i'$ of a pair of binary words u, u' without any linear dependency on a bit $u_i$, $u_i'$ of the pair of binary words u, u'. Further, it may also be possible that the common Boolean function $f$ may depend linearly on a first bit $u_i$, $u_i'$ of a pair of binary words u, u' and depend nonlinearly on a second bit $u_j$, $u_j'$ of the pair of binary words u, u'.

In some embodiments, a number of bits of a binary word of a pair of binary words u, u' is equal to or larger than a number of bits of the intermediate binary word z. Preferably, a number of bits of a binary word of a pair of binary words u, u' is equal to a number of bits of the intermediate binary word z, so that a high error detection probability can be achieved.

Some embodiments relate to an error detector 120 configured to provide an error signal y with a number of bits lower than a number of bits of the intermediate binary word z.

For example, it might be sufficient to provide an error signal with one bit width. This 1-bit-signal may be equal to 0 if the intermediate value determiner 110 works faultlessly and the binary words of the pair of binary words are equal or inverted to each other, and equal to 1 otherwise or the other way around. In other words, the error signal y may be a 1-bit-signal and the error detector 120 may provide the error signal y with a first bit value (0 or 1) for equal or inverted binary words of a pair of binary words u, u', if the intermediate value determiner 120 works faultlessly, and for a faultlessly working intermediate value determiner 120, if the binary words of a pair of binary words u, u' are equal. Further, the error detector 120 may provide the 1-bit-signal with a second bit value (correspondingly 1 or 0) for unequal and uninverted binary words of a pair of binary words u, u' or an erroneously working intermediate value determiner 110.

Alternatively, the error signal y may be a signal with two bit width. This 2-bit-signal can indicate more states than the 1-bit-signal mentioned before (faultless state or erroneous state). For example, the 2-bit-error signal y may indicate whether the intermediate binary word is equal to the reference binary word or the inverted reference binary word. Further, stuck-at failures at the output of the error detector 120 may also be detectable, since the 2-bit-signal may change between two error bit sequences (predefined bit sequences for the different states to be indicated by the error signal) for different pairs of equal or inverted binary words (e.g. the first pair of equal or inverted binary words and the second pair of equal or inverted binary words as mentioned above). In other words, the error signal y may be a 2-bit-signal and the error detector 120 may provide the error signal y with a first error bit sequence (e.g. 01) for a first pair of equal or inverted binary words and with the inverted first error bit sequence (e.g. 10) for a second pair of equal or inverted binary words, if the intermediate value determiner 110 and the error detector 120 work faultlessly. Further, the error detector may provide the error signal y with a second error bit sequence (e.g. 00 or 11) for a pair of unequal and uninverted binary words, if the intermediate value determiner 110 and the error detector 120 work faultlessly, or for an erroneously working intermediate value determiner 110 or an erroneously working error detector 120, if the binary words u, u' of the pair of binary words are equal or inverted to each other. The second error bit sequence is unequal to the first bit error sequence and to the inverted first error bit sequence.

In the following, some embodiments are described in more detail. In this connection, several additional and/or optional features are described, which can be implemented all together or some of them may be implemented independent from each other in combination with the basic concept described above. Since the apparatus described above compares pairs of binary words, it may also be called a comparator in the following. Further, the error detector is also called an allocator.

FIG. 2 shows a comparator 200 for comparing two n digit data words $u=u_1, \ldots, u_n$ and $u'=u_1', \ldots, u_n'$ consisting of an intermediate value determiner Zw 21 having 2n inputs and n outputs, at which n intermediate values $z=z_1 \ldots, z_n$ (bits of the intermediate binary word) are output and which comprises an allocator ZU 22 (error detector) having n inputs and $r \geq 1$ outputs which are connected downstream. The n inputs of the allocator 22 are connected to the corresponding n outputs of the intermediate value determiner 21 while outputting an r-component error signal at its r outputs.

The intermediate value determiner Zw 21 is configured so that the intermediate values $z=z_1, \ldots, z_n$ (intermediate binary word) output at its n outputs are determined from the bits of the data words $u=u_1, \ldots, u_n$ and $u'=u_1' \ldots, u_n'$ to be compared according to the relations $$z_1 = A_1 \oplus u_1 \oplus u_1' \oplus f(u_1, u_1', \ldots, u_n, u_n')$$
$$z_2 = A_2 \oplus u_2 \oplus u_2' \oplus f(u_1, u_1', \ldots, u_n, u_n')$$
$$\vdots$$
$$z_n = A_n \oplus u_n \oplus u_n' \oplus f(u_1, u_1', \ldots, u_n, u_n'),$$

wherein $f(u_1, u_1', \ldots, u_n, u_n')$ is a Boolean function (common Boolean function), for which $$f(u_1, u_1', \ldots, u_n, u_n') \neq \text{const}$$

$$f(u_1, u_1', \ldots, u_n, u_n') \neq u_i \oplus u_i' \text{ for } i=1, \ldots, n$$

and $$f(u_1, u_1', \ldots, u_n, u_n') \neq u_i \oplus u_i' \oplus 1 \text{ for } i=1, \ldots, n$$

apply. Here, $A_1, \ldots, A_n$ are binary constants. Further, $z_i$ is a bit of the intermediate binary word z, $A_i$ is a binary constant, $u_i$ is a bit of a first binary word u of the pair of binary words, $u_i'$ is a bit of the second binary word u' of the pair of binary words, i indicates a position of a bit within a binary word and $f(u_1, u_1', \ldots, u_n, u_n')$ is a common Boolean function.

The allocator 22 is configured so that when inputting the intermediate values z an r-dimensional error signal $y(z)=y_1(z), \ldots, y_r(z)$ with $r \geq 1$ is output at its r-dimensional output, so that
$y(A_1, A_2, \ldots, A_n)$ and $y(A_1 \oplus 1, A_2 \oplus 1, \ldots, A_n \oplus 1) = y(\overline{A_1}, \ldots, \overline{A_n})$ represent a value which does not indicate an error.

For all values $z_1, z_2, \ldots, z_n$ which are not equal to $A_1, A_2, \ldots, A_n$ and which are not equal to $A_1 \oplus 1, A_2 \beta 1, \ldots, A_n \oplus 1$, the error signal y represents a value which indicates an error.

If, for example, r=2, then $$y(z_1, z_2, \ldots, z_n) = [y_1(z_1, z_2, \ldots, z_n), y_2(z_1, z_2, \ldots, z_n)]$$

and $y_1$ and $y_2$ may be realized in a special implementation as $$y_1(z_1, z_2, \ldots, z_n) = \overline{\bigvee_{i=1}^{n} (z_i \oplus A_i)}$$

and $$y_2(z_1, z_2, \ldots, z_n) = \bigwedge_{j=1}^{n} (z_j \oplus A_j)$$

wherein $y_1(z_1, z_2, \ldots, z_n)$ is the first bit of the error signal, $y_2(z_1, z_2, \ldots, z_n)$ is the second bit of the error signal, $z_i, z_j$ is a bit of the intermediate binary word, $A_i, A_j$ is a binary constant and i, j is an indices indicating a position of a bit within the intermediate binary word.

If $z = (A_1, \ldots, A_n)$ $$y_1(A_1, A_2, \ldots, A_n) = \overline{\bigvee_{i=1}^{n} (A_i \oplus A_i)} = 1$$

and $$y_2(A_1, A_2, \ldots, A_n) = \bigwedge_{j=1}^{n} (A_j \oplus A_j) = 0$$

results.

If $z = (A_1 \oplus 1, \ldots, A_n \oplus 1)$, $$y_1(A_1 \oplus 1, A_2 \oplus 1, \ldots, A_n \oplus 1) = \overline{\bigvee_{i=1}^{n} (A_i \oplus 1 \oplus A_i)} = 0$$

and

-continued
$$y_2(A_1 \oplus 1, A_2 \oplus 1, \ldots, A_n \oplus 1) = \bigwedge_{j=1}^{n}(A_j \oplus 1 \oplus A_j) = 1$$

results.

If $u=u'$ and thus $z=A_1, \ldots, A_n$ or $z=(A_1\oplus 1, \ldots, A_n\oplus 1)$, then $y=[y_1, y_2]\in\{(0,1),(1,0)\}$ and the proposed circuitry outputs a two-rail value (01) or (10).

If $u\neq u'$ and $u\neq\bar{u}$ then $z\neq A_1, \ldots, A_n$ and $z\neq(A_1\oplus 1, \ldots, A_n\oplus 1)$.

There is then at least one component $z_j\neq A_j$ and at least one component $z_k\neq A_k\oplus 1$, from which $y_1=0$ and $y_2=0$ result, and the fact that $u\neq u'$ is then detected because $y_1=y_2=0$ is not a two-rail value.

If $r=1$, then $y(z)=y_1(z)$ and $y_1$ may for example be selected to be $$y_1(z) = \overline{\bigvee_{i=1}^{n}(z_i \oplus A_i)} \oplus \bigwedge_{j=1}^{n}(z_j \oplus A_j).$$

wherein $y_1(z_1, \ldots, z_n)$ is the error signal, $z_i$, $z_j$ are bits of the intermediate binary word, i,j are indices indicating a position number of a bit within the intermediate binary word and $A_i$, $A_j$ are binary constants.

If $u=u'$ and thus $z=A_1, \ldots, A_n$ or $z=(A_1\oplus 1, \ldots, A_n\oplus 1)$, then $y_1=1$. If $u\neq u'$ and $u\neq\bar{u}'$ then $z\neq A_1, \ldots, A_n$ and $z\neq(A_1\oplus 1, \ldots, A_n\oplus 1)$, then $y_1=0$.

Now, the special case is considered that the binary constants $A_1, A_2, \ldots, A_n$ are all equal to 0.

If again for example $r=2$, then $y(z_1, \ldots, z_n)=[y_1(z_1, \ldots, z_n), y_2(z_1, \ldots, z_n)]$. If now additionally, as assumed, $A_1=A_2=\ldots A_n=0$, then an error is indicated, when $y(z_1, \ldots, z_n)$ is not equal $y(0, \ldots, 0)$ or not equal $y(1, \ldots, 1)$.

In this case, the values $y_1$ and $y_2$ may then be determined so that $$y_1(z_1, \ldots, y_n) = \overline{\bigvee_{i=1}^{n} z_i}$$

and $$y_2(z_1, \ldots, y_n) = \bigwedge_{j=1}^{n} z_j$$

applies.

No error is indicated when $z_1, \ldots, z_n$ either equals $0, \ldots, 0$ or equals $1, \ldots, 1$. If no error is present, then $y_1, y_2\in\{(0,1),(1,0)\}$ and $y_1, y_2$ form a two-rail value (2-bit signal, error signal with 2 bit width). An error is indicated when $y_1, y_2\in\{(0,0)(1,1)\}$ applies. This is always the case here, when $z_1, \ldots, z_n$ unequal $0, \ldots, 0$ or unequal $1, \ldots, 1$ or when, for example, a stuck-at error occurs on one of the lines carrying the values $y_1$ and $y_2$. Now the case is considered that $r=1$, wherein it is again assumed that $A_1=\ldots=A_n=0$.

If $r=1$, then $y=y_1$ may be realized in a special implementation of the proposed concept as $$y_1(z_1, \ldots, y_n) = \overline{\bigvee_{i=1}^{n}(z_i)} \oplus \bigwedge_{j=1}^{n}(z_j).$$

Then $y_1(1, 1, \ldots, 1)=y_1(0, 0, \ldots, 0)=0$ applies and no error is indicated. In all other cases, i.e. for $z_1, \ldots, z_n$ unequal $0, \ldots, 0$ and unequal $1, \ldots, 1$, $y_1(z_1, z_2, \ldots, z_n)=1$ applies, and an error is indicated.

For explaining the functioning and the improvement of error detection in the running operation, the case is considered that $u=u'$. Then the following applies $$z_1 = A_1 \oplus f(u_1, u_1', \ldots, u_n, u_n')$$
$$z_2 = A_2 \oplus f(u_1, u_1', \ldots, u_n, u_n')$$
$$\vdots$$
$$z_n = A_n \oplus f(u_1, u_1', \ldots, u_n, u_n'),$$

and depending on whether $f(u_1, u_1', \ldots, u_n, u_n')$ is equal 0 or equal 1, the following applies, $$z_1 = A_1$$
$$z_2 = A_2$$
$$\vdots$$
$$z_n = A_n$$

or $$z_1 = A_1 \oplus 1$$
$$z_2 = A_2 \oplus 1$$
$$\vdots$$
$$z_n = A_n \oplus 1$$

and the intermediate values z, depending on the function value of the Boolean function $f$ (common Boolean function) take on complementary values to each other. As the function value of the function $f$ depends on the concrete values of the data words to be compared, the intermediate values (intermediate binary word) change their value depending on the data words (binary words) to be compared. Stuck-at errors on the outputs of the intermediate value determiner Zw 21 are thus detected in the running operation in contrast to stuck-at-0 errors at the outputs of the XOR operator 17 (logical exclusive or) in FIG. 8.

As an example, now the case is considered for n=4

$$f(u_1, u_1', \ldots, u_n, u_n') = u_1 \vee u_1' = u_1 \oplus u_1' \oplus u_1 \wedge u_1'$$

and $A_1=A_2=A_3=0$, $A_4=1$.

The intermediate values $z=z_1, \ldots, z_4$ are then determined to be $$z_1 = u_1 \wedge u_1'$$
$$z_2 = u_2 \oplus u_2' \oplus u_1 \vee u_1'$$
$$z_3 = u_3 \oplus u_3' \oplus u_1 \vee u_1'$$
$$z_4 = 1 \oplus u_4 \oplus u_4' \oplus u_1 \vee u_1' = u_4 \oplus u_4' \oplus \overline{u_1 \vee u_1'}.$$

In this embodiment, the error signals $y_1$ and $y_2$ may be determined by $$y_1 = \overline{z_1 \vee z_2 \vee z_3 \vee \overline{z_4}}$$

and $$y_2 = z_1 \wedge z_2 \wedge z_3 \wedge \overline{z_4}.$$

FIG. 3 shows the corresponding proposed comparator setup 300 from an intermediate value determiner Zw 311 and a downstream allocator ZU 312. The intermediate value determiner consists of an AND gate 31 (logical and) having two inputs and one output, and an OR gate 32 (logical or) having two inputs and one output, three XOR gates 33, 34 and 35 having three inputs and one output and one negator 36.

The allocator 312 consists of an NOR gate 39 (logical not or) having four inputs and one output and an AND gate 310 having four inputs and one output and two negators 37 and 38.

The first input of the AND gate 31 is connected to the input line carrying the signal $u_1$ wherein the line is simultaneously connected to the first input of the OR gate 32. The second input of the AND gate 31 is connected to the input line carrying the signal $u_1'$ wherein the line is simultaneously connected to the second input of the OR gate 32. The output of the OR gate 32 is simultaneously connected to the first input of the XOR gate 33, the XOR gate 34 and, via an inverter 36, to the first input of the XOR gate 35. The second input of the XOR gate 33 is connected to the line carrying the input signal $u_2$, while the third input of the XOR gate 33 is connected to the input line carrying the input signal $u_2'$. The second input of the XOR gate 34 is connected to the line carrying the input signal $u_3$, while the third input of the XOR gate 34 is connected to the input line carrying the input signal $u_3'$. The second input of the XOR gate 35 is connected to the line carrying the input signal $u_4$, while the third input of the XOR gate 34 is connected to the input line carrying the input signal $u_4'$.

The outputs of the AND gate 31, the XOR gate 33, the XOR gate 34 and the XOR gate 35 carry the intermediate signals $z_1$, $z_2$, $z_3$, $z_4$ of the intermediate value determiner Zw 311. These outputs are connected to the inputs of the allocator ZU 312 which is setup from the NOR gate 39, the AND gate 310 and the negators 37 and 38.

The output of the AND gate 31 carrying the intermediate signal $z_1$ is connected both to the first input of the NOR gate 39 and also to the first input of the AND gate 310. The output of the XOR gate 33 carrying the intermediate signal $z_2$ is connected both to the second input of the NOR gate 39 and also to the second input of the AND gate 310. The output of the XOR gate 34 carrying the intermediate signal $z_3$ is connected both to the third input of the NOR gate 39 and also to the third input of the AND gate 310. The output of the XOR gate 35 carrying the intermediate signal $z_4$ is connected both to the fourth input of the NOR gate 39 via the inverter 37 and also to the fourth input of the AND gate 310 via the inverter 38.

The output of the NOR gate 39 carries or guides the error detection signal $Y_1$, while the output of the AND gate 310 carries the error signal $y_2$.

If for i=1, ..., n, $u_i = u_i'$ applies, then $z_1 = z_2 = z_3 = 1$, and $z_4 = 0$, when $u_1 = u_1' = 1$, and thus $f(u_1, u_1', \ldots, u_n, u_n') = 1$, and $z_1 = z_2 = z_3 = 0$, and $z_4 = 1$, when $u_1 = u_1' = 0$ and thus $f(u_1, u_1', \ldots, u_n, u_n') = 0$. In the first case $y_1, y_2 = (1, 0)$ and in the second case $y_1, y_2 = (0, 1)$ applies. If for example $u_2 \neq u_2'$ and $u_1 = u_1'$, $u_3 = u_3'$, $u_4 = u_4'$ then $z_1 = u_1 \vee u_1'$, $z_2 = 1 \oplus (u_1 \wedge u_1')$, $z_3 = u_1 \wedge u_1'$ and $z_4 = 1 \oplus (u_1 \wedge u_1')$ and for $u_1 = u_1' = 1$, it is $z_1 = z_3 = 1$, $z_2 = z_4 = 0$ and $y_1 = y_2 = 1$, which indicates an error. Correspondingly, for $u_1 = u_1' = 0$ it results that $z_1 = z_3 = 0$, $z_2 = z_4 = 1$ and also $y_1 = Y_2 = 1$, which again indicates an error.

If the intermediate value determiner Zw 311 is optimized together with the allocator ZU 312, then the inverter 36 of the intermediate value determiner 311 and the two inverters 38 and 37 of the allocator may be omitted, as they mutually compensate with respect to their effect.

Now the case is considered that the function $f$ is a linear function, wherein $$f(u_1, u_1', \ldots, u_n, u_n') = a_1 u_1 \oplus \ldots \oplus a_n u_n \oplus b_1 u_1' \oplus \ldots \oplus b_n u_n' \quad (1)$$

with $a_i, b_j \in \{0, 1\}$, $$a_i \wedge b_i = 0 \text{ for } i = 1, \ldots, n \quad (2)$$

and $$\bigvee_{i=1}^{n} a_i \vee \bigvee_{j=1}^{n} b_j = 1 \quad (3)$$

apply.

Condition (2) guarantees that for all $i \in \{1, \ldots, n\}$, $f(u_1, u_1', \ldots, u_n, u_n') \neq u_i \oplus u_i'$ and $f(u_1, u_1', \ldots, u_n, u_n') \neq u_i \oplus u_i' \oplus 1$ applies, and condition (3) guarantees that $f(u_1, u_1', \ldots, u_n, u_n')$ is no constant.

As an example, now the case is considered that n=4, $a_1 = a_2 = a_3 = a_4 = 0$ and $b_1 = 1$, $b_2 = b_3 = b_4 = 0$ for $j \in \{1, \ldots, n\}$ and $A_k = 0$ for $k \in \{1, 2, 3, 4\}$ and r=2.

$f(u_1, u_1', \ldots, u_4, u_4') = u_1'$ applies then and the intermediate values $z_1, z_2, z_3, z_4$ (bits of the intermediate binary word) are determined by $$z_1 = u_1,$$

$$z_2 = u_2 \oplus u_2' \oplus u_1',$$

$$z_3 = u_3 \oplus u_3' \oplus u_1',$$

$$z_4 = u_4 \oplus u_4' \oplus u_1',$$

In the described embodiment, the error signals $y_1$ and $y_2$ may be determined by $$y_1 = z_1 \vee z_2 \vee z_3 \vee z_4$$

and $$y_2 = \overline{z_1 \wedge z_2 \wedge z_3 \wedge z_4}.$$

FIG. 4 shows the associated circuit for the proposed comparator 400. The comparator 400 of FIG. 4 consists of an intermediate value determiner Zw 411 having 2·4=8 inputs at which the bits $u_1$, $u_1'$, $u_2$, $u_3$, $u_3'$, $u_4$, $u_4'$ (bits of the binary words of a pair of binary words) to be compared are applied, and four outputs at which the four intermediate values $z_1$, $z_2$, $z_3$, $z_4$ are output, and an allocator ZU 412 which is connected downstream from the intermediate value determiner Zw 411. The allocator ZU 412 has four inputs for inputting the four intermediate values $z_1, \ldots, z_4$ which are connected to the corresponding outputs of the intermediate value determiner Zw 411, and two outputs 49 and 410 for outputting the error signals $y_1$ and $y_2$ (representing an error signal with 2 bit width).

The input of the intermediate value determiner carrying the input signal $u_1$ is directly connected through to the output carrying the intermediate value $z_1$. The input carrying the input signal $u_1'$ is connected to the first input each of an XOR gate 41, an XOR gate 43 and an XOR gate 45. To the second input of the XOR gate 41, whose output is connected to the first input of an XOR gate 42, the input carrying the input signal $u_2$ is connected. To the second input of the XOR gate 42, whose output carries the intermediate signal $z_2$, the input carrying the input signal $u_2'$ is connected. To the second input of the XOR gate 43, whose output is connected to the first input of an XOR gate 44, the input carrying the input signal $u_3$ is connected. To the second input of the XOR gate 44, whose output carries the intermediate signal $z_3$, the input carrying the input signal $u_3'$ is connected. To the second input of the XOR gate 45, whose output is connected to the first input of an XOR gate 46, the input carrying the input signal $u_4$ is connected. To the second input of the XOR gate 46, whose output carries the intermediate signal $z_4$, the input carrying the input signal $u_4'$ is connected.

The allocator ZU 412 consists of an OR gate 47 having four inputs and an output 49 carrying the error signal $y_1$ and an NAND gate 48 (logical not and) having four inputs and an output 410 carrying the error signal $y_2$.

For i=1, . . . , 4, the i-th output of the intermediate value determiner Zw 411 carrying the intermediate signal $z_i$ is connected to the i-th input both of the OR gate 47 and also to the i-th input of the NAND gate 48.

It is advantageous with this proposed comparator, that all XOR gates 41, . . . , 46 can be tested in the running operation without an error having to exist in the input data. At the two inputs of the XOR gate 41, the values $u_1'$ and $u_2$ are applied. It is obvious that values (0, 0), (0, 1), (1, 0), (1, 1) are applied at this XOR gate, when for example u=u' takes on the non-interfered values (0000), (0100), (1011), (1100).

Further, at the two inputs of the XOR gate 42 all possible input values (00), (10), (10), (11) are applied, when for example u=u' takes on the values (0000), (0100), (1011), (1010). For the remaining XOR gates 43, 44, 45, 46 it may be seen analogously that with suitable inputs u=u' indeed all possible four value combinations (00), (01), (10), (11) are input into the corresponding gates, whereby their complete testability is given in the running operation when a sufficient number of different input values u=u' is available. Thus, these gates can be completely tested in the running operation.

In some embodiments the apparatus for comparing pairs of binary words further comprises a mapper. This mapper may be connected to an intermediate value determiner and may provide a pair of binary words to be compared to the intermediate value determiner based on a pair of input binary words. In this connection, the mapper may map pairs of input binary words to pairs of binary words to be compared, so that the number of different possible pairs of binary words to be compared is larger than a number of different possible pairs of input binary words.

In this way, a limitation of a number of different possible pairs of input binary words, which is caused for example by a preceding processing using only this limited number of different binary words, can be compensated by mapping this limited number of different possible pairs of input binary words to a larger number of different possible pairs of binary words to be compared. In this way, a change of the intermediate binary word from the reference binary word to the inverted reference binary word occurs more frequently, so that especially stuck-at failures within the intermediate value determiner can be detected more efficiently (e.g. faster).

The mapper can be implemented in various ways. For example, two linear feedback shift registers (LFSR) may be used. In this case, a first linear feedback shift register may determine a first binary word of a pair of binary words to be compared based on a first binary word of a pair of input binary words and a second linear feedback shift register may determine the second binary word of the pair of binary words to be compared based on the second binary word of the pair of input binary words.

A more detailed example of an apparatus 500 for comparing pairs of binary words u, u', w, w' with a mapper 530 comprising two linear feedback shift registers 51, 52 is shown in FIG. 5.

In FIG. 5, two linear feedback shift registers 51 and 52 are connected upstream from the self-testing comparator. If the data inputs $u=u_1, \ldots, u_N$ and $u'=u_1', \ldots, u_N'$ only take on few values it may thus be achieved that at the inputs of the intermediate value determiner 53 many different values are applied. The input values $w_1, \ldots, w_n$ and $w_1', \ldots, w_n'$ of the intermediate value determiner 53 result from the input values $u=u_1, \ldots, u_N$ and $u'=u_1', \ldots, u_N'$ by the fact that components of the state values of the linear feedback shift registers 51 and 53 are XOR-ed (combined by a logical XOR function) with corresponding components of the input values u or u'. To simplify the description it is in the following for example assumed that N=n. It may also be sensible, that N>n or also that N<n.

In FIG. 5, the data inputs $u_1, u_2, \ldots, u_n$ are guided into a first LSFR 51 in parallel. The data inputs $u_1', u_2', \ldots, u_n'$ are guided into a second LSFR 52 in parallel. The outputs $w_1, \ldots, w_n$ of the first LSFR 51 and the outputs $w_1', \ldots, w_n'$ of the second LSFR 52 form the inputs of the intermediate value determiner Zw 53. Alternatively it is for example also possible here that the outputs of the shift registers 51 and 52 are simply the components of their states, which are XOR-ed with the components of the data inputs $u_1, u_2, \ldots, u_n$ and $u_1', u_2', \ldots, u_n'$, so that the state transition of the linear feedback shift registers may be executed independent of the input values $u_1, u_2, \ldots, u_n$ and $u_1', u_2' \ldots, u_n'$.

The remaining setup (intermediate value determiner 53 and allocator 54) corresponds to the illustration of FIG. 2.

The two LSFRs (51 and 52) run synchronously in normal operation, realize the same state transition function and are started with the same starting state. The state transition function may here be implemented so that all possible states of the LSFR, except the state 00 . . . 0, are passed cyclically.

The setup of the LSFR 51 and 52 and the linking of the components of the states with the components of the input value is now to be explained in detail for a special embodiment.

In the embodiment above, the state of the first LSFR 51 is connected component after component to data inputs $u_1, u_2, \ldots, u_n$, XOR-ed, and forms the values $w_1, \ldots, w_n$. The state of the second LSFR 52 is XOR-ed component after component with data inputs $u_1, u_2, \ldots, u_n$ and forms the values $w_1', \ldots, w_n'$.

Figure 6:
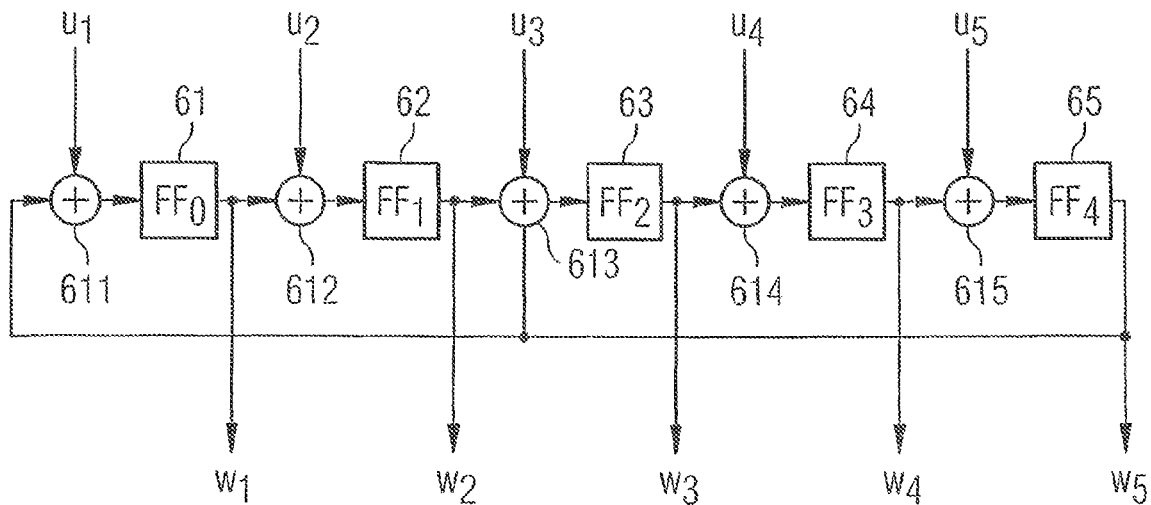
FIG. 6 is a block diagram of a linear feedback shift register with parallel data inputs (N=n)

In FIG. 6 it is illustrated as an example how the data inputs may be connected to the components of an LSFR. In FIG. 6, the LSFR consist of the flip-flops 61, 62, . . . , 65 ($FF_0, \ldots, FF_4$). The output of the XOR gate 611 forms the input of the flip-flop 61. The output of the flip-flop 61 is connected to the first input of the XOR gate 612 and the line which carries the output value $w_1$. The output of the XOR gate 612 forms the input of the flip-flop 62. The output of the flip-flop 62 is connected to the first input of the XOR gate 613 and to the line which carries the output value $w_2$. The output of the XOR gate 613 forms the input of the flip-flop 63. The output of the flip-flop 63 is connected to the first input of the XOR gate 614 and to the line which carries the output value $w_3$. The output of the XOR gate 614 forms the input of the flip-flop 64. The output of the flip-flop 64 is connected to the first input of the XOR gate 615 and to the line which carries the output value $w_4$. The output of the XOR gate 615 forms the input of the flip-flop 65. The output of the flip-flop 65 is connected to the first input of the XOR gate 611, the third input of the XOR gate 613 and to the line which carries the output value $w_5$.

The data input which carries the signal $u_1$ is guided into the second input of the XOR gate 611. The data input which carries the signal $u_2$ is guided into the second input of the XOR gate 612. The data input which carries the signal $u_3$ is guided into the second input of the XOR gate 613. The data input which carries the signal $u_4$ is guided into the second input of the XOR gate 614. The data input which carries the signal $u_5$ is guided into the second input of the XOR gate 615.

The intermediate value determiner 110, the error detector 120, the mapper 530 and/or other optional units may be independent hardware units or part of a computer, a digital signal processor or a microcontroller as well as a computer program or a software product for running on a computer, a digital signal processor or a microcontroller. The intermediate value determiner 110, the bit error corrector 120, the mapper 530 and/or other optional components may be implemented independent from each other or may be realized at least partially together.

Some embodiments relate to an apparatus for comparing pairs of binary words u, u' comprising a means for determining an intermediate binary word and a means for providing an error signal. The means for determining an intermediate binary word is configured to determine an intermediate binary word z so that the intermediate binary word z is equal to a reference binary word for a first pair of equal or inverted binary words, so that the intermediate binary word z is equal to the inverted reference binary word for a second pair of equal or inverted binary words and so that the intermediate binary word z is unequal to the reference binary word and the inverted reference binary word for a pair of unequal and uninverted binary words if the means for determining an intermediate binary word works faultlessly. The first pair of equal or inverted binary words is different from the second pair of equal or inverted binary words. Further, the means for providing an error signal is configured to provide an error signal y based on the intermediate binary word z so that the error signal y indicates whether or not the binary words u, u' of a pair of binary words are equal or inverted, if the means for determining an intermediate binary word works faultlessly, and indicates whether or not the means for determining an intermediate binary word works faultlessly if the binary words u, u' of a pair of binary words are equal or inverted.

Figure 7:
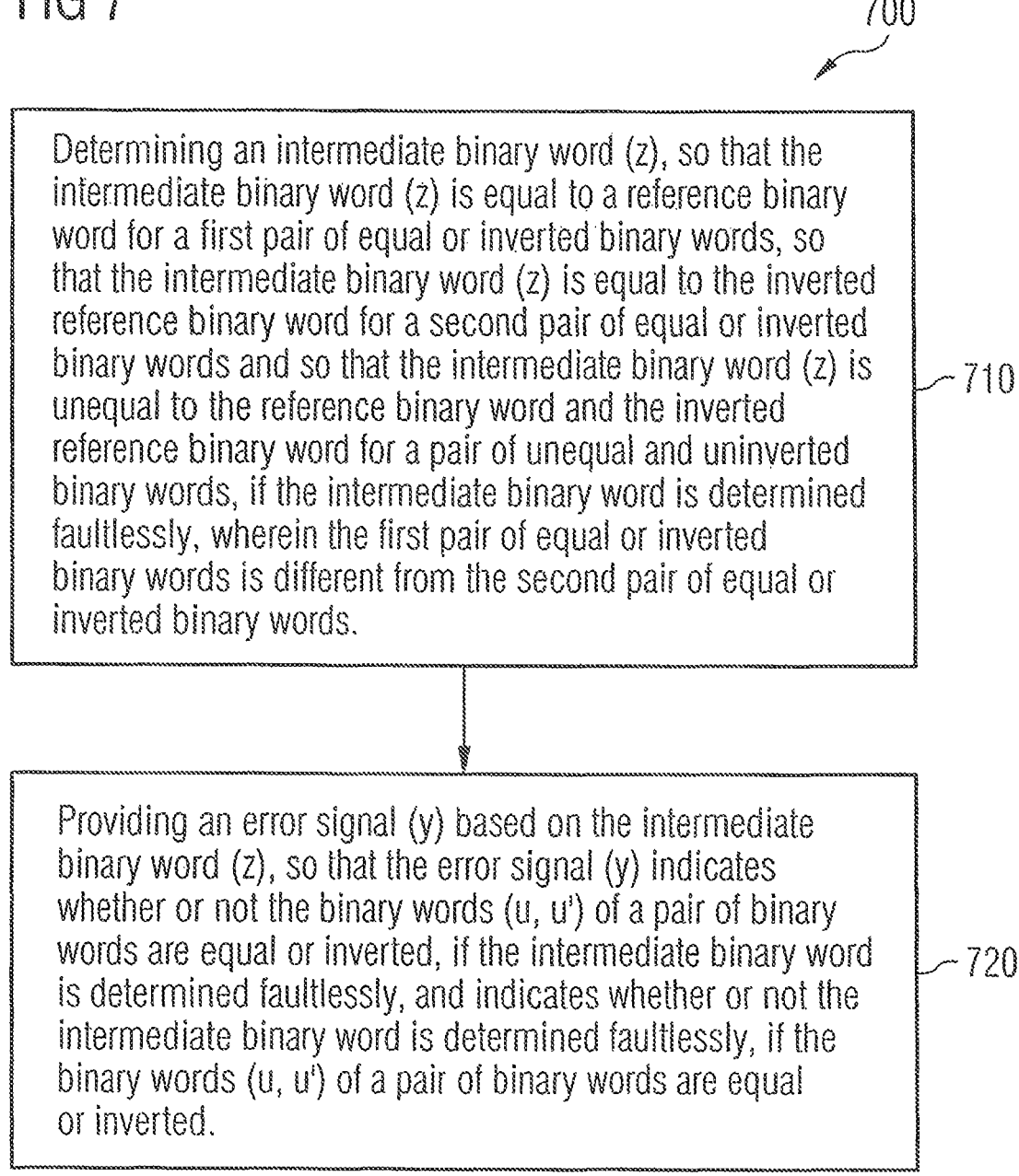
FIG. 7 is a flowchart of a method for comparing pairs of binary words.

FIG. 7 shows a flowchart of a method 700 for comparing pairs of binary words u, u' according to an embodiment. The method 700 comprises determining 710 an intermediate binary word z so that the intermediate binary word z is equal to a reference binary word for a first pair of equal or inverted binary words, so that the intermediate binary word z is equal to the inverted reference binary word for a second pair of equal or inverted binary words and so that the intermediate binary word z is unequal to the reference binary word and the inverted reference binary word for a pair of unequal and uninverted binary words, if the intermediate binary word is determined faultlessly. The first pair of equal or inverted binary words is different from the second pair of equal or inverted binary words. Further, the method 700 comprises providing 720 an error signal y based on the intermediate binary word z, so that the error signal y indicates whether or not the binary words u, u' of a pair of binary words are equal or inverted, if the intermediate binary word is determined faultlessly, and indicates whether or not the intermediate binary word is determined faultlessly if the binary words u, u' of a pair of binary words are equal or inverted.

Additionally, the method 700 may comprise further steps representing one or more of the optional aspects of the proposed concept described above.

Some embodiments relate to a self-checking comparator. The comparator may enable an improvement of the error detection in the running operation. Additionally, the comparator may not require an additional periodic input signal in comparison to known comparators.

A circuitry for comparing two n-component data words $u=u_1,\ldots,u_n$ and $u'=u_1',\ldots,u_n'$ may comprise an intermediate value determiner Zw having 2n inputs and n outputs for generating intermediate values $z=z_1,\ldots,z_n$ is present, wherein at the 2n inputs at the right position the data words $u=u_1,\ldots,u_n$ and $u'=u_1',\ldots,u_n'$ are applied and at the n outputs the intermediate values $z=z_1,\ldots,z_n$ formed by the intermediate value determiner are output. Further, the intermediate value determiner is configured so that the intermediate values are formed according to the relations $$z_1 = A_1 \oplus u_1 \oplus u_1' \oplus f(u_1, u_1', \ldots, u_n, u_n')$$
$$z_2 = A_2 \oplus u_2 \oplus u_2' \oplus f(u_1, u_1', \ldots, u_n, u_n')$$
$$\vdots$$
$$z_n = A_n \oplus u_n \oplus u_n' \oplus f(u_1, u_1', \ldots, u_n, u_n')$$

by the intermediate value determiner Zw, wherein the function $f(u_1, u_1',\ldots, u_n, u_n')$ is a 2n digit Boolean function which determined in such a way that $$f(u_1,u_1',\ldots,u_n,u_n') \neq \text{const}$$

$$f(u_1,u_1',\ldots,u_n,u_n') \neq u_i \oplus u_i' \text{ for } i=1,\ldots,n$$

and $$f(u_1,u_1',\ldots,u_n,u_n') \neq u_i \oplus u_i' \text{ for } i=1,\ldots,n$$

apply and wherein $A_1,\ldots,A_n$ are binary constants and $n \geq 2$. Further, the circuitry comprises an allocator ZU having n inputs and r outputs for forming an r digit error signal $y(z)=[y_1(z),\ldots,y_r(z)]$ with $r \geq 1$ of an intermediate value $z=z_1,\ldots,z_r$ to whose n inputs the n outputs of the intermediate value determiner Zw are connected and whose r outputs output an r digit error signal $y(z)=[y_1(z),\ldots,y_r(z)]$. The allocator is configured so that error signals $y(A)=[y_1(A),\ldots,y_r(A)]$ and $y(\overline{A})=[y_1(\overline{A}),\ldots,y_r(\overline{A})]$ are allocated to the intermediate values $A=A_1,\ldots,A_n$ and $\overline{A}=\overline{A}_1,\ldots,\overline{A}_n$ by the allocator ZU, wherein the error signals indicate no error, and to each intermediate value z which is not equal to A and not equal to $\overline{A}$, an error signal y(z) is allocated which is different from y(A) and $y(\overline{A})$ and which signalizes a difference in the n-component data words $u=u_1,\ldots,u_n$ and $u'=u_1',\ldots,u_n'$.

According to an aspect $$f(u_1,u_1',\ldots,u_n,u_n')=a_1u_1 \oplus \ldots \oplus a_nu_n \oplus b_1u_1' \oplus \ldots \oplus b_nu_n' \qquad (4)$$

with $a_i, b_j \in \{0,1\}$ is a linear Boolean function and $$a_i \wedge b_i = 0 \text{ for } i = 1, \ldots n \quad (5)$$

and $$\bigvee_{i=1}^{n} a_i \vee \bigvee_{j=1}^{n} b_j = 1 \quad (6)$$

apply.

For example, $f(u_1, u_1', \ldots, u_n, u_n') = u_i$ for $i \in \{1, \ldots, n\}$.

In another example, $f(u_1, u_1', \ldots, u_n, u_n') = u_j'$ for $j \in \{1, \ldots, n\}$.

According to another aspect $r=2$.

For example, the allocator ZU may be implemented so that the two components $y_1$ and $y_2$ of the error detection signal formed by the allocator ZU are formed according to the relations $$y_1(z_1, z_2, \ldots, z_n) = \overline{\bigvee_{i=1}^{n} (z_i \oplus A_i)}$$

and $$y_2(z_1, z_2, \ldots, z_n) = \bigwedge_{j=1}^{n} (z_j \oplus A_j).$$

Alternatively $r=1$.

In this case, the allocator ZU may be implemented so that the error signal $y_1$ formed by the allocator ZU is formed according to the relation $$y_1(z_1, \ldots, y_n) = \overline{\bigvee_{i=1}^{n} (z_i)} \oplus \bigwedge_{j=1}^{n} (z_j).$$

According to another aspect, the binary constants $A_1, \ldots, A_n$ are equal to 0.

Alternatively, the binary constants $A_1, \ldots, A_n$ are equal to 1.

In a further alternative, at least one of the binary constants $A_1, \ldots, A_n$ is equal to 1 and at least one of the binary constants is equal to 0.

For example, the intermediate value determiner and the allocator may be at least partially realized together.

Although some aspects of the described concept have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A hardware-implemented apparatus for comparing a pair of input binary words (u, u'), the apparatus comprising:
   an intermediate value determiner configured to determine an intermediate binary word (z), based on the pair of input binary words (u, u'), and compare the intermediate binary word to a reference binary word or to an inversion of the reference binary word; and
   an error detector configured to detect that the binary words of the pair of input binary words (u, u') are equal or inverted to with respect to each other to detect a faultless preceding processing of the pair of input binary words when the intermediate binary word (z) is equal to the reference binary word or equal to the inversion of the reference binary word, and to detect that the binary words of the pair of input binary words (u, u') are not equal and not inverted with respect to each other to detect an erroneous preceding processing of the pair of input binary words when the intermediate binary word (z) is unequal to the reference binary word and unequal to the inversion of the reference binary word;

wherein a bit of the intermediate binary word (z) depends on a XOR-combination of a binary constant, a bit of a first binary word of the pair of input binary words (u, u'), a corresponding bit of a second binary word of the pair of input binary words (u, u'), and a non-constant Boolean function of at least the bit of the first binary word of the pair of input binary words and the corresponding bit of the second binary word of the pair of input binary words.

2. The apparatus according to claim 1, wherein the intermediate value determiner is configured to determine a bit of the intermediate binary word (z), so that the bit of the intermediate binary word (z) is equal to a value derivable by an intermediate bit Boolean function depending on at least one bit ($u_i$, $u'_i$) of the pair of input binary words (u, u') to be compared.

3. The apparatus according to claim 2, wherein the intermediate bit Boolean function depends on an XOR-combination of a bit ($u_i$) of a first binary word (u) of the pair of input binary words (u, u'), a corresponding bit ($u'_i$) of a second binary word (u') of the pair of input binary words (u, u') and a common Boolean function (f), wherein the common Boolean function (f) depends on at least one bit ($u_j$, $u'_j$) of the pair of input binary words (u, u'), wherein the common Boolean function (f) is unequal to an XOR-combination and to an inverted XOR-combination of a bit ($u_i$) of the first binary word (u) of the pair of input binary words (u, u') and a corresponding bit ($u'_i$) of the second binary word (u') of the pair of input binary words (u, u').

4. The apparatus according to claim 3, wherein the intermediate bit Boolean function further depends on an XOR-combination with a binary constant ($A_i$).

5. The apparatus according to claim 3, wherein each bit ($z_i$) of the intermediate binary word (z) is equal to a value derivable by an individual intermediate bit Boolean function.

6. The apparatus according to claim 5, wherein each individual intermediate bit Boolean function depends on the same common Boolean function.

7. The apparatus according to claim 3, wherein the common Boolean function (f) depends linearly on at least one bit ($u_i$, $u_i'$) of the pair of input binary words (u, u') without any non-linear dependency on a bit ($u_j$, $u'_j$) of the pair of input binary words (u, u').

8. The apparatus according to claim 1, wherein a number of bits of a binary word of the pair of input binary words (u, u') and a number of bits of the intermediate binary word (z) is equal.

9. The apparatus according to claim 1, wherein a number of bits of the error signal (y) is lower than a number of bits of the intermediate binary word (z).

10. The apparatus according to claim 1, further comprising a mapper configured to provide a pair of binary words (w, w') to be compared to the intermediate value determiner based on the pair of input binary words (u, u'), wherein the mapper is configured to map the pair of input binary words (u, u') to the pair of binary words (w, w') to be compared, so that a number of different possible pairs of binary words to be compared is larger than a number of different possible pairs of input binary words.

11. The apparatus according to claim 10, wherein the mapper comprises two linear feedback shift registers, wherein a first linear feedback shift register is configured to determine a first binary word (w) of a pair of binary words (w, w') to be compared based on a first binary word (u) of the pair of input binary words (u, u') and a second linear feedback shift register is configured to determine the second binary word (w') of the pair of binary words (w, w') to be compared based on the second binary word (u') of the pair of input binary words (u, u').

12. A hardware-implemented apparatus for comparing a pair of input binary words (u, u'), the apparatus comprising:
a means for determining an intermediate binary word configured to determine an intermediate binary word (z) based on the pair of input binary words (u,u'), and compare, the intermediate binary word (z) to a reference binary word or to an inversion of the reference binary word; and
a means for providing an error signal configured to provide an error signal (y) based on the intermediate binary word (z) and detect that the binary words of the pair of input binary words (u, u') are equal or inverted with respect to each other to detect a faultless preceding processing of the pair of input binary words when the intermediate binary word (z) is equal to the reference binary word or equal to the inversion of the reference binary word, and to detect that the binary words of the pair of input binary words (u, u') are not equal and not inverted with respect to each other to detect an erroneous preceding processing of the pair of input binary words when the intermediate binary word (z) is unequal to the reference binary word and unequal to the inversion of the reference binary word;
wherein a bit of the intermediate binary word (z) depends on a XOR-combination of a binary constant, a bit of a first binary word of the pair of input binary words (u, u'), a corresponding bit of a second binary word of the pair of input binary words (u, u'), and a non-constant Boolean function of at least the bit of the first binary word of the pair of input binary words and the corresponding bit of the second binary word of the pair of input binary words.

13. A method for comparing a pair of input binary words (u, u'), the method comprising:
determining an intermediate binary word (z) based on the pair of input binary words (u,u'), and comparing, the intermediate binary word (z) to a reference binary word or to an inversion of the reference binary word; and
providing an error signal (y) based on the intermediate binary word (z) and detecting that the binary words of the pair of input binary words (u, u') are equal or inverted with respect to each other to detect a faultless preceding processing of the pair of input binary words when the intermediate binary word (z) is equal to the reference binary word or equal to the inversion of the reference binary word, and detecting that the binary words of the pair of input binary words (u, u') are not equal and not inverted with respect to each other to detect an erroneous preceding processing of the pair of input binary words when the intermediate binary word (z) is unequal to the reference binary word and unequal to the inversion of the reference binary word;
wherein a bit of the intermediate binary word (z) depends on a XOR-combination of a binary constant, a bit of a first binary word of the pair of input binary words (u, u'), a corresponding bit of a second binary word of the pair of input binary words (u, u'), and a non-constant Boolean function of at least the bit of the first binary word of the pair of input binary words and the corresponding bit of the second binary word of the pair of input binary words.

14. A computer program with a program code which runs on a computer or a micro controller and is stored on a non-transitory computer-readable medium, wherein the program code performs a method for comparing a pair of input binary words (u, u'), the method comprising:

determining an intermediate binary word (z) based on the pair of input binary words (u,u'), and comparing the intermediate binary word (z) to a reference binary word or to an inversion of the reference binary word; and providing an error signal (y) based on the intermediate binary word (z) and detecting that the binary words of the pair of input binary words (u, u') are equal or inverted with respect to each other to detect a faultless preceding processing of the pair of input binary words when the intermediate binary word (z) is equal to the reference binary word or equal to the inversion of the reference binary word, and detecting that the binary words of the pair of input binary words (u, u') are not equal and not inverted with respect to each other to detect an erroneous preceding processing of the pair of input binary words when the intermediate binary word (z) is unequal to the reference binary word and unequal to the inversion of the reference binary word;

wherein a bit of the intermediate binary word (z) depends on a XOR-combination of a binary constant, a bit of a first binary word of the pair of input binary words (u, u'), a corresponding bit of a second binary word of the pair of input binary words (u, u'), and a non-constant Boolean function of at least the bit of the first binary word of the pair of input binary words and the corresponding bit of the second binary word of the pair of input binary words.

* * * * *